US011336232B2

(12) United States Patent
Bao et al.

(10) Patent No.: US 11,336,232 B2
(45) Date of Patent: May 17, 2022

(54) DOHERTY AMPLIFIER ARRANGEMENT

(71) Applicant: Telefonaktiebolaget LM Ericsson (publ), Stockholm (SE)

(72) Inventors: Mingquan Bao, Västra Frölunda (SE); David Gustafsson, Gothenburg (SE); Kristoffer Andersson, Gothenburg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 2 days.

(21) Appl. No.: 16/961,736

(22) PCT Filed: May 30, 2018

(86) PCT No.: PCT/EP2018/064175
§ 371 (c)(1),
(2) Date: Jul. 13, 2020

(87) PCT Pub. No.: WO2019/228619
PCT Pub. Date: Dec. 5, 2019

(65) Prior Publication Data
US 2021/0058038 A1    Feb. 25, 2021

(51) Int. Cl.
*H03F 1/02*         (2006.01)
*H03F 1/56*         (2006.01)
*H03F 3/60*         (2006.01)

(52) U.S. Cl.
CPC .............. *H03F 1/0288* (2013.01); *H03F 1/56* (2013.01); *H03F 3/602* (2013.01); *H03F 2200/255* (2013.01); *H03F 2200/318* (2013.01)

(58) Field of Classification Search
CPC .......... H03F 1/0288; H03F 1/56; H03F 3/602; H03F 2200/255; H03F 2200/318
(Continued)

(56) References Cited

U.S. PATENT DOCUMENTS 6,128,478 A    10/2000 Kim
7,427,895 B1    9/2008 Okubo et al.
(Continued)

FOREIGN PATENT DOCUMENTS

EP        2958232 A1    12/2015
WO     2018013022 A1     1/2018

OTHER PUBLICATIONS

Bryant Baker, "A 3.6 GHz Doherty Power Amplifier with a 40 dBm Saturated Output Power using GaN on SiC HEMT Devices", Portland University, Master's thesis published in Jun. 2014. pp. (Year: 2014).*
(Continued)

Primary Examiner — Hafizur Rahman
(74) Attorney, Agent, or Firm — Sage Patent Group

(57) ABSTRACT

The present disclosure relates to an amplifier arrangement comprising a first amplifier, a second amplifier and an output combiner arranged to combine respective output signals of the first amplifier and the second amplifier into an output signal of the amplifier arrangement. An amplifier arrangement input signal is arranged as input signal to the first amplifier, and a difference signal, representing a difference between the amplifier arrangement input signal and a scaled output signal of the first amplifier, is arranged as input to the second amplifier. The output combiner is arranged to modulate the loads of the first amplifier and the second amplifier in dependence of the output signal of the second amplifier.

9 Claims, 6 Drawing Sheets

(58) Field of Classification Search
USPC .................................................... 330/124 R
See application file for complete search history.

(56) References Cited

U.S. PATENT DOCUMENTS

| | | | |
|---|---|---|---|
| 9,577,586 B1 | 2/2017 | Uzunoglu | |
| 9,614,479 B2 | 4/2017 | Hallberg et al. | |
| 9,960,738 B1 | 5/2018 | Chen et al. | |
| 2019/0028062 A1* | 1/2019 | Shinjo | H03F 3/245 |

OTHER PUBLICATIONS

PCT International Search Report and Written Opinion, dated Feb. 12, 2019, for International Application PCT/EP2018/064175, 10 pages.

Halberg, William et al., IEEE Transactions on Microwave Theory and Techniques, "A Doherty Power Amplifier Design Method for Improved Efficiency and Linearity", Dec. 2016, pp. 4491-4504, vol. 64, No. 12.

Morteza Nick et al., IEEE Transactions on Microwave Theory and Techniques, "Adaptive Input-Power Distribution in Doherty Power Amplifiers for Linearity and Efficiency Enhancement", Nov. 2010, pp. 2764-2771, vol. 58, No. 11.

Kang, Hyunuk et al., IEEE Transactions on Circuits and Systems II: Express Briefs, "Symmetric Three-Way Doherty Power Amplifier for High Efficiency and Linearity", Aug. 2017, pp. 862-866, vol. 64, No. 8.

Cho, Kyoung-Joon et al., IEEE Transactions on Microwave Theory and Techniques, "A Highly Efficient Doherty Feedforward Linear Power Amplifier for W-CDMA Base-Station Applications", Jan. 2005, pp. 292-300, vol. 53, No. 1.

First Examination Report Action dated Nov. 10, 2021 for Indian Patent Application No. 202047029107, 5 pages.

* cited by examiner

DOHERTY AMPLIFIER ARRANGEMENT

CROSS-REFERENCE TO RELATED APPLICATIONS

This application is a 35 U.S.C. § 371 national stage application for International Application No. PCT/EP2018/064175, entitled "AN IMPROVED DOHERTY AMPLIFIER ARRANGEMENT", filed on May 30, 2018, the disclosures and contents of which are hereby incorporated by reference in their entireties.

TECHNICAL FIELD

The present disclosure relates to an amplifier arrangement comprising a first amplifier, a second amplifier and an output combiner arranged to combine respective output signals of the first amplifier and the second amplifier into an output signal of the amplifier arrangement,

BACKGROUND

In communication systems such as a 5G MIMO (Multiple Input Multiple Output) it is desired to reduce the DC (Direct Current) power consumption, and therefore a power amplifier having a high power added efficiency (PAE) is desired. The efficiency of traditional class-AB power amplifiers (PA) is however rapidly degraded when the output power is backed off from its maximum. The efficiency can be improved by incorporating the power amplifier into special transmitter/PA architectures, such as a Doherty power amplifier (DPA), that is widely adopted in commercial applications and has a high efficiency over a wide output power range.

A DPA is described in U.S. Pat. No. 9,614.479 and typically comprises a class AB or class B biased main amplifier, and a class-C biased auxiliary amplifier. The main amplifier is always in an "on" state and the auxiliary amplifier is in an "on" state only when the input-power is relatively large due to its class-C bias, at which input power the main amplifier reaches saturation. The auxiliary amplifier then provides additional power, having an output current that increases linearly with increasing input voltage/power. Otherwise, when the auxiliary amplifier is in an "off" state, the output current of the auxiliary amplifier is zero.

An important principle of Doherty operation is to modulate the load impedance seen by the main amplifier via active current injection using the auxiliary amplifier. Based on this principle, high efficiency can be maintained both at peak power and at the average power level of the signal.

The output of the auxiliary amplifier then reduces the load impedance of the main amplifier, letting the main amplifier deliver more current to the load. This is often referred to as load modulation, where output power from the main amplifier and the auxiliary amplifier are combined by a so-called Doherty combiner, to realize the load modulation and obtain a high PAE over a wide output power range.

A Doherty combiner is a three-port network, where two input ports are connected separately to the outputs of the main amplifier and the auxiliary amplifier, and an output port is connected to the load of DPA. A traditional Doherty combiner consists of a quarter-wavelength transmission line, acting as an impedance inverter, another example of a Doherty combiner is disclosed in U.S. Pat. No. 9,614.479.

In a conventional DPA, at least a half of the input power is fed into the auxiliary amplifier, and while the auxiliary amplifier is in the "off" state, this power is lost which results in at least a 3-dB gain loss, reducing the gain of the DPA.

A common-source/emitter configured transistor is in many cases used as an auxiliary amplifier, and to switch it "on" at a desired output power, the transistor is class-C biased. This means that the maximum output current/power and gain of the auxiliary amplifier is reduced compared to the ideal case where it is biased in class-B. Allocating more input power to the auxiliary amplifier than to the main amplifier results in decreased overall gain of the DPA, and increasing the auxiliary amplifier's output current can reduce the "turn-on" input power and lower the PAE. It is thus difficult to obtain a desired current profile from the auxiliary amplifier by tuning gate/base bias, transistor's size, and input power.

The DPA's efficiency can also be improved by varying the gate bias according to the amplitude of the input signal. Unfortunately, the broad bandwidth of the input signal and a high peak to average power ratio pose severe challenge on the design of the system controlling the gate bias. This is for example disclosed by Yoichi Okubo, et al, "Doherty amplifier with improved linearity" and U.S. Pat. No. 7,427,895.

It is therefore a desire to provide a power amplifier arrangement according to the above that has a relatively high power added efficiency in view of previous such power amplifier arrangements.

SUMMARY

It is an object of the present disclosure to provide a power amplifier arrangement according to the above that has a relatively high power added efficiency in view of previous such power amplifier arrangements.

Said object is obtained by means of an amplifier arrangement comprising a first amplifier, a second amplifier and an output combiner arranged to combine respective output signals of the first amplifier and the second amplifier into an output signal of the amplifier arrangement. An amplifier arrangement input signal is arranged as input signal to the first amplifier. A difference signal, representing a difference between the amplifier arrangement input signal and a scaled output signal of the first amplifier, is arranged as input to the second amplifier. The output combiner is arranged to modulate the loads of the first amplifier and the second amplifier in dependence of the output signal of the second amplifier.

This provides an advantage of enabling biasing of the second amplifier close to class B, where the output current/power of the second amplifier has a sharp turn-on performance. The PAE (power added efficiency) gain and linearity are improved compared to a traditional Doherty amplifier According to some aspects, the first amplifier has a first amplifier output port and a first amplifier input port connected to a first input port, and the second amplifier has a second amplifier output port and a second amplifier input port connected to a second input port. The output combiner is connected to the respective amplifier output ports and is adapted for load modulation. The amplifier arrangement further comprises a difference signal arrangement that is adapted to provide the difference signal, which is fed to the second amplifier input port. The second amplifier input port is connected to the second input port via the difference signal arrangement.

According to some aspects, the first input port and the second input port are connected to a power divider that in turn is connected to an amplifier arrangement input port for the amplifier arrangement input signal. The power divider is adapted to convert a signal at the amplifier arrangement input port into a first input signal at the first input port with a first power and a first relative phase, and a second input signal at the second input port with a second power and a second relative phase. The amplifier arrangement input signal is arranged as input signal to the first amplifier and the difference signal arrangement via the power divider.

In this way, the relative power and phase of each input signal can be controlled.

According to some aspects, the difference signal arrangement comprises a coupling device and a difference combiner, where the difference combiner comprises a first combiner input port, a second combiner input port and a difference port. The difference port is adapted to output a difference between signals input at the combiner input ports, constituting the difference signal. The second combiner input port is connected to the second input port, and the difference port is connected to the second amplifier input port. The coupling device is adapted to provide the scaled output signal from the signal at the first amplifier output port and to feed it to the first combiner input port.

The amplifier arrangement can thus be realized by using standard components.

According to some aspects, the coupling device comprises a first capacitor that is adapted to provide the scaled output signal.

This enables an uncomplicated coupling device.

According to some aspects, the coupling device comprises a parallel transmission line portion and a capacitor, which are adapted to provide the scaled output signal.

This enables a matched accurate coupling device.

According to some aspects, the difference combiner comprises a first transmission line, adapted for tuning the phase of the input signal, that is connected to the first combiner input port. The difference combiner further comprises a second transmission line connected to the second input port and adapted to tune the phases of the input signals at the difference port such that the difference signal is generated at the difference port, where the transmission lines are connected to the difference port.

This enables phase tuning at the difference combiner.

According to some aspects, the first amplifier input port is connected to the first input port via a first impedance matching network, and the difference port is connected to the second amplifier input port via a second impedance matching network.

This provides an enhanced impedance matching and thus enhanced efficiency for the amplifier arrangement.

According to some aspects, the output combiner is a Doherty combiner. In this way, well-known designs can be used for the output combiner.

According to some aspects, the output combiner comprises an inverting port connected to the first amplifier output port, an amplifier arrangement output port, and a common port connected to the second amplifier output port and the amplifier arrangement output port. There is an impedance inverter connected between the inverting port and the amplifier arrangement output port.

According to some aspects, the impedance inverter is constituted by either one transmission line or two coupled transmission lines, each transmission line having a certain impedance and having a length of a quarter wavelength for a wavelength comprised in a frequency band for signals fed into the amplifier arrangement via the amplifier arrangement input port.

This enables the output combiner to be at least partly merged with the coupling device.

BRIEF DESCRIPTION OF THE DRAWINGS

The present disclosure will now be described more in detail with reference to the appended drawings, where:

FIG. 1 shows a schematical view of a an amplifier arrangement according to the present disclosure;

DETAILED DESCRIPTION

Figure 2A:
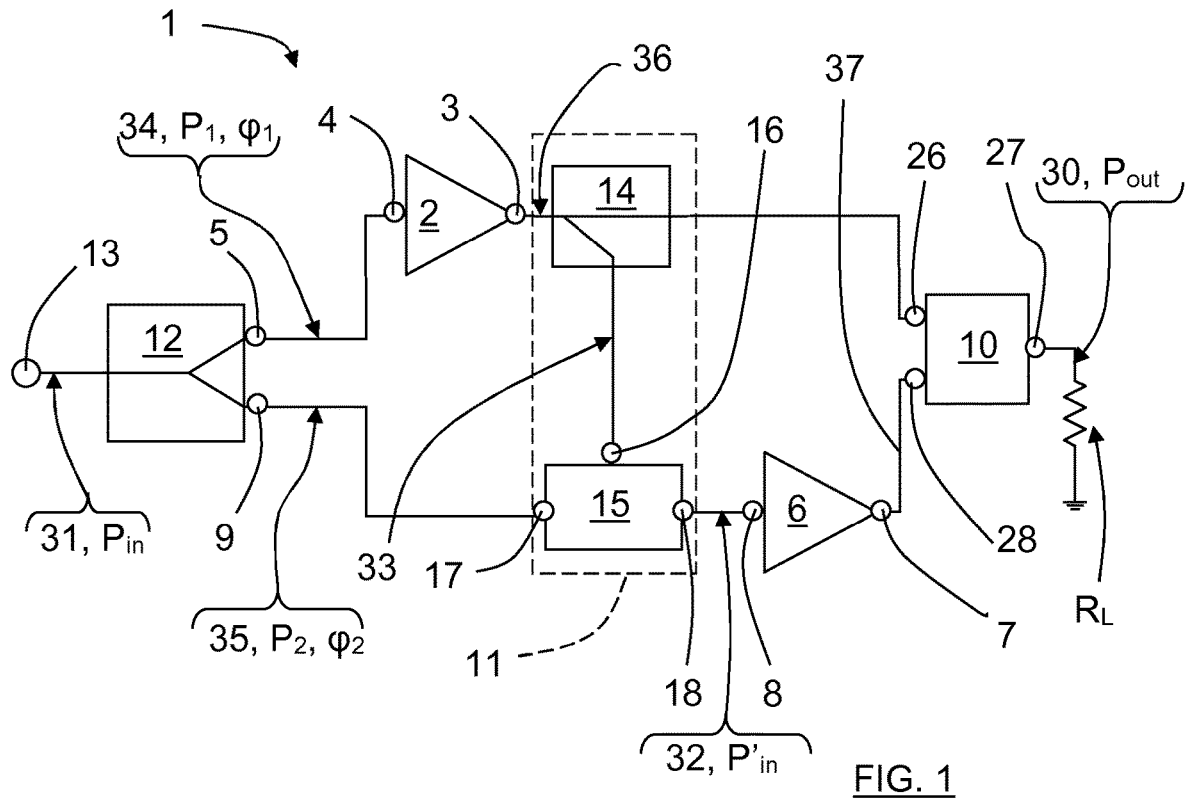
FIG. 2A shows graphs illustrating power relations for certain signals.

With reference to FIG. 1, there is an amplifier arrangement 1 comprising a first amplifier 2, a second amplifier 6 and an output combiner 10 arranged to combine respective output signals 36, 37 of the first amplifier 2 and the second amplifier 6 into an output signal 30 of the amplifier arrangement 1.

An amplifier arrangement input signal 31 at an amplifier arrangement input port 13 is arranged as input signal to the first amplifier 2. According to the present disclosure, a difference signal 32, representing a difference between the amplifier arrangement input signal 31 and a scaled output signal 33 of the first amplifier 2, is arranged as input to the second amplifier 6. The output combiner 10 is furthermore arranged to modulate corresponding loads of the first amplifier 2 and the second amplifier 6 in dependence of the output signal 37 of the second amplifier 6. According to some aspects, the output combiner 10 is a so-called Doherty combiner.

According to some aspects, the first amplifier 2 has a first amplifier output port 3 and a first amplifier input port 4 connected to a first input port 5, and the second amplifier 6 has a second amplifier output port 7 and a second amplifier input port 8 connected to a second input port 9. The output combiner 10 is connected to the respective amplifier output ports 3, 7 and is adapted for load modulation, wherein the amplifier arrangement 1 further comprises a difference signal arrangement 11 that is adapted to provide the scaled output signal 33 and to feed the difference signal 32 to the second amplifier input port 8. The second amplifier input port 8 is connected to the second input port 9 via the difference signal arrangement 11.

The first input port 5 and the second input port 9 are connected to a power divider 12 that in turn is connected to the amplifier arrangement input port 13. The power divider 12 is adapted to convert a signal at the amplifier arrangement input port 13 into a first input signal 34 at the first input port 5 with a first power $P_1$ and a first relative phase $\varphi_1$, and a second input signal 35 at the second input port 9 with a second power $P_2$ and a second relative phase $\varphi_2$. In this manner, the amplifier arrangement input signal 31 is arranged as input signal to the first amplifier 2 and the difference signal arrangement 11 via the power divider 12. The relative phases $\varphi_1$, $\varphi_2$ are selected such that the outputs from the first amplifier 2 main the second amplifier 6 can be added in-phase at a load $R_L$ connected to an amplifier arrangement output port 27.

According to some aspects, the difference signal arrangement 11 comprises a coupling device 14 and a difference combiner 15, where the difference combiner 15 comprises a first combiner input port 16, a second combiner input port 17 and a difference port 18 that is adapted to output a difference between signals input at the combiner input ports 16, 17, constituting the difference signal 32. The second combiner input port 17 is connected to the second input port 9 and the difference port 18 is connected to the second amplifier input port 8, The coupling device 14 is adapted to provide the scaled output signal 33 from the output signal 36 at the first amplifier output port 3 and to feed it to the first combiner input port 16. The combiner input ports 16, 17 are fed with the scaled output signal 33 and the second input signal 35 which signals 33, 35 are out of phase with each other at the output port (18) in order to provide the difference signal 32. The difference signal 32 has an amplitude that is determined by an amplitude difference of the scaled output signal 33 and the second input signal 35. According to some aspects, the second power $P_2$ of the second input signal 35 exceeds the power of the scaled output signal 33.

Most of the output power of the first amplifier 2 is delivered to the output combiner 10 and a fraction of the output power of the first amplifier 2, the scaled output signal 33, is injected into the difference combiner 15, where the amount of scaling is determined by a coupling factor of the coupling device 14.

Figure 2B:
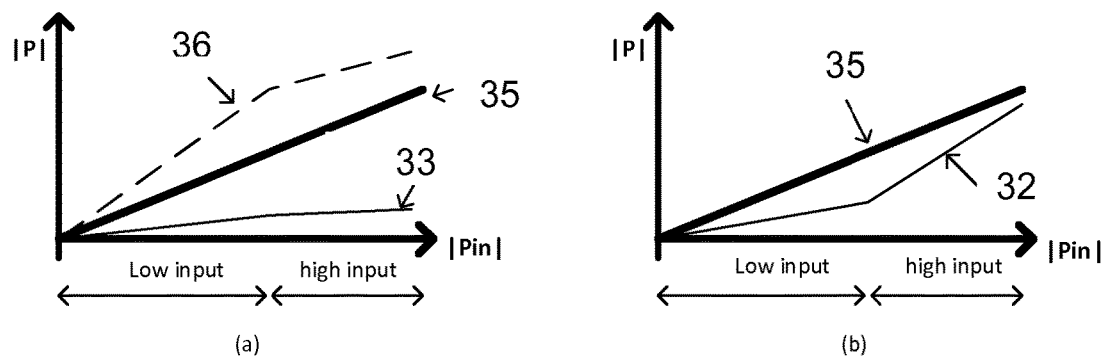
FIG. 2B shows graphs illustrating power relations for certain signals.

FIG. 2A shows the voltage amplitudes of the output signal 36 of the first amplifier 2, the second input signal 35, and the scaled output signal 33 as a function of the magnitude of the voltage $V_{in}$ of the amplifier arrangement input signal 31. FIG. 2B shows the voltage amplitudes of the second input signal 35 and the difference signal 32 a function of the magnitude of the voltage $V_{in}$ of the amplifier arrangement input signal 31. The voltage of the amplifier arrangement input signal 31 is divided in a low input region and a high input region, where the first amplifier 2 becomes saturated in the high input region.

This visualizes a concept of the present disclosure; to feed the second amplifier 6 with the difference signal 32 instead of a portion of the amplifier arrangement input signal 31 directly, as for a traditional Doherty amplifier. While the first amplifier 2 is not saturated, in the low input region, there is ideally no difference signal 32 and thus no input signal to the second amplifier 6; in FIG. 2B the difference signal 32 is relatively low in the low input region. When the first amplifier 2 is saturated, as shown in FIG. 2B, in the high input region, there is a difference signal 32 that is fed to the second amplifier 6, enabling the second amplifier 6 to compensate for the saturation of the first amplifier 2 and provide load modulation so that the first amplifier 2 can output more current that would otherwise be possible.

In the low input region, the amplitude of the difference signal 32 is less than the input to the second amplifier 6 in a traditional Doherty amplifier, which allows the second amplifier 6 to be biased for close to class-B operation instead of class-C operation. The second amplifier 6 is switched "on" in the high input power region and provides a relative large output power. Consequently, the PAE and gain are improved in the present amplifier arrangement 1 compared to a traditional Doherty amplifier. Examples of calculated comparisons between different exemplary versions of the present amplifier arrangement 1 and a traditional Doherty amplifier will be presented and discussed later.

The outputs of the first amplifier 2 and the second amplifier 6 are combined in the output combiner 10 that suitably is a Doherty combiner, where a so-called load modulation occurs, which provides a relatively high PAE (power added efficiency) over a wide power range. The output combiner 10 comprises an inverting port 26 connected to the first amplifier output port 3 via the coupling device 14, the amplifier arrangement output port 27, and a common port 28 connected to the second amplifier output port 7. The output signal 30 of the amplifier arrangement 1, having an amplifier arrangement output power $P_{out}$, is output at the amplifier arrangement output port 27.

The coupling device 14 has a certain, relatively small, effect on the load modulation, which according to some aspects should be considered. The coupling device 14 and the output combiner 10 can be merged as will be discussed in examples below.

It should be noted that there exist other types of amplifier devices where a difference or error signal is used, for example a feedforward amplifier as described in EP 1503495 or in Kyoung-Joon Cho, Jong-Neon Kim, and Shawn P. Stapleton "A Highly Efficient Doherty Feedforward Linear Power Amplifier for W-CDMA Base-Station Applications", IEEE TRANSACTIONS ON MICROWAVE THEORY AND TECHNIQUES, VOL. 53, NO. 1, JANUARY 2005 where there is a main amplifier and a cancellation or error amplifier. A difference between a coupled main amplifier output and an input signal is fed to the error amplifier.

Such a traditional feedforward amplifier is, however, quite different from an amplifier arrangement according to the present disclosure in its purpose and construction since there is no output combiner adapted for load modulation in a feedforward amplifier. In a traditional feedforward amplifier, the main amplifier in itself can be constituted by a complete traditional Doherty amplifier (DPA) or even an amplifier arrangement according to the present disclosure.

A traditional feedforward amplifier aims at minimizing the fundamental component of an error signal, reducing the intermodulation components, while, in an amplifier arrangement according to the above, the fundamental component is kept, driving the second amplifier 6.

Figure 3:
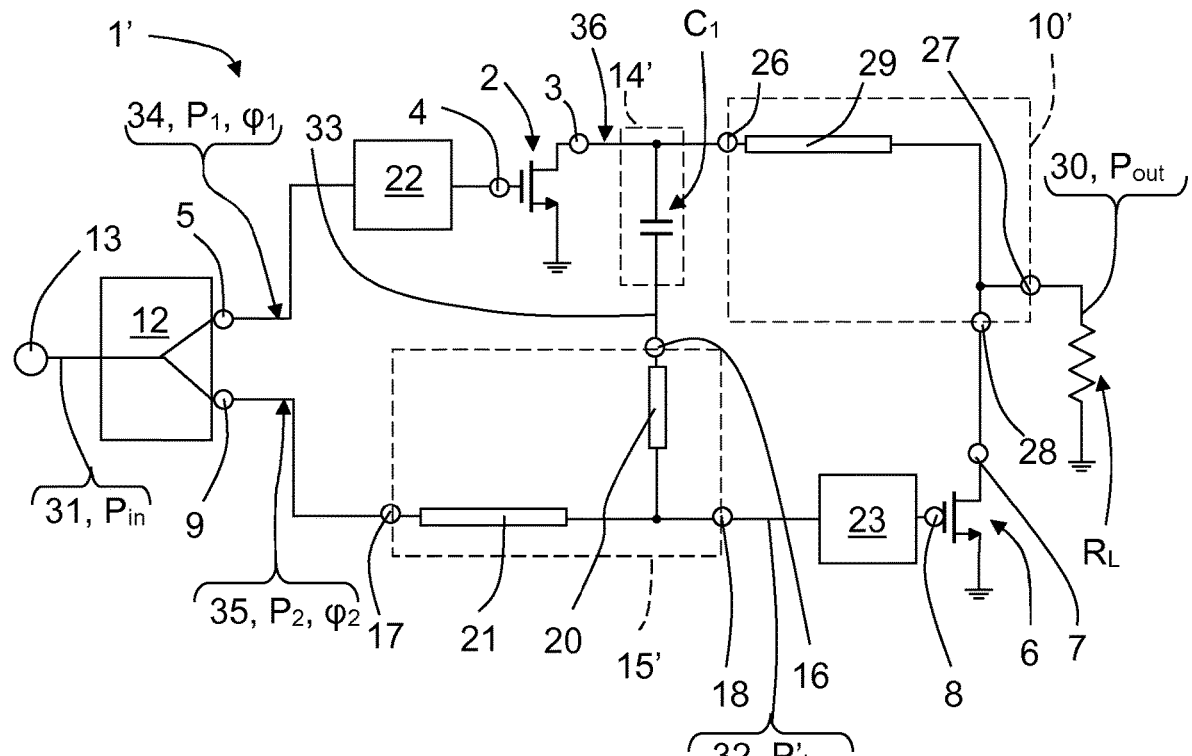
FIG. 3 shows a schematical view of a an amplifier arrangement according to a first detailed example of the present disclosure.
Figure 4:
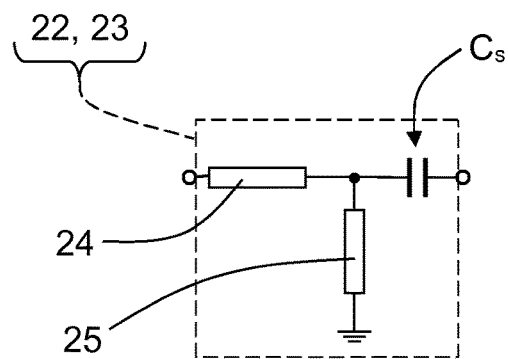
FIG. 4 shows a schematical view of an impedance matching network.

With reference to FIG. 3, a first more detailed example an amplifier arrangement 1' will be described. For reasons of clarity, the DC biasing circuits are omitted. The first amplifier 2 and the second amplifier 6 are here exemplified as common source-configured transistors, where the amplifier arrangement 1' comprises impedance matching networks 22, 23. The first amplifier input port 4 is connected to the first input port 5 via a first impedance matching network 22, and the difference port 18 is connected to the second amplifier input port 8 via a second impedance matching network 23. As shown in FIG. 4, each impedance matching network 22, 23 comprises a corresponding serial transmission line 24 connected in series with a corresponding serial capacitor $C_s$ and with a corresponding grounded transmission line 25.

The first power $P_1$ of the first input signal 34 that is fed to the first amplifier 2 can be slightly higher than the second power $P_2$ of the second input signal 35. More input power to the first amplifier 2 results in that a higher gain is available. Allocation of more input power to the first amplifier 2 can reduce a possible adverse influence of the scaled output signal 33 that is diverted from the output signal 36 of the first amplifier 2.

Here, the coupling device 14' comprises a first capacitor $C_1$ that is adapted to provide the scaled output signal 33, according to some aspects having a capacitance of about 15 fF. The first capacitor $C_1$ controls what percentage of the total current of the output signal 36 of the first amplifier 2 that is allocated to the difference combiner 15. The smaller value the first capacitor $C_1$, the less current flows into the difference combiner 15'.

The difference combiner 15' comprises a first transmission line 20 that is connected to the first combiner input port 16 and adapted to tune the phase of the scaled output signal 33 at the output port 18, and a second transmission line 21 connected to the second input port 17 and adapted to tune the phases of the input signals at the difference port 18 such that the difference signal 32 is generated at the difference port 18. These other ends of these transmission lines 20, 21 are connected to the difference port 18.

Figure 6:
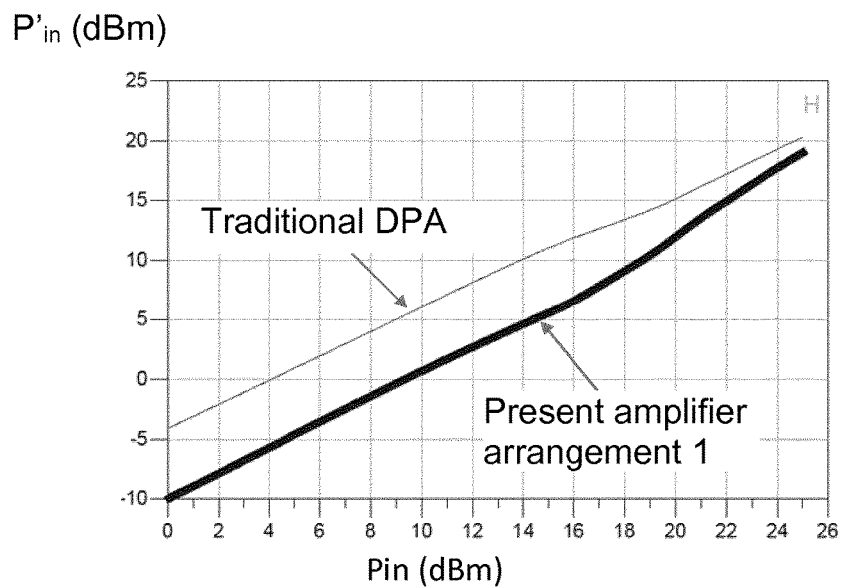
FIG. 6-11 show graphical illustrations of differences between the amplifier arrangement according to the present disclosure and a traditional PDA for the detailed examples.

Illustrative examples of calculated graphs for the present amplifier arrangement 1' according to the first example and a traditional DPA are shown for the present example in FIG. 6-FIG. 9. In FIG. 6, the x-axis is the magnitude of the power $P_{in}$ of the amplifier arrangement input signal 31, and the y-axis is the input power Fin to the second amplifier 6, i.e. of the difference signal 32, where $$P'_{in} = \tfrac{1}{2}\operatorname{Re}(V_G I^*_{in}),$$

and where $V_G$ and $I^*_{in}$ are intrinsic gate voltage and current of the transistor constituting the second amplifier 6.

Figure 7:
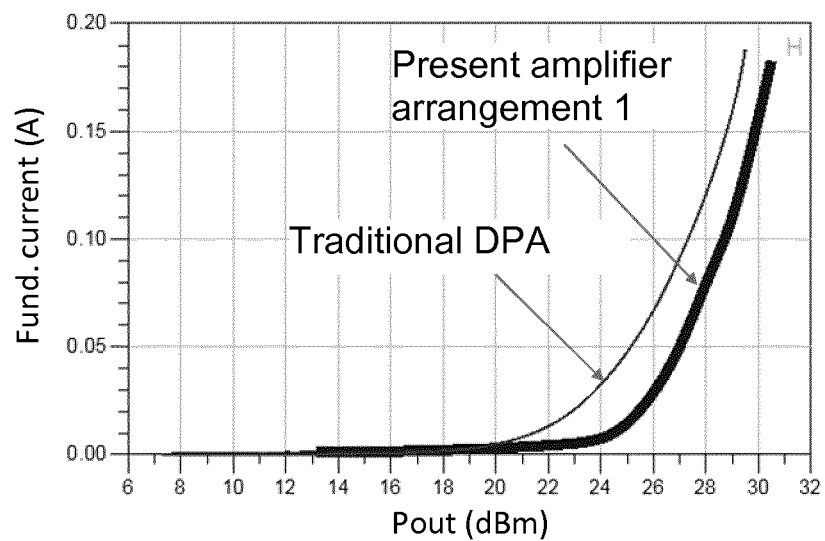

In a low input power region, in this example about 0-5 dBm, the input power $P'_{in}$ to the second amplifier 6 is about 6 dB lower than the corresponding input power to an auxiliary amplifier in a traditional DPA. Low input power allows the second amplifier 6 to be biased close to class B, keeping it in the "off" state, while the higher input power to an auxiliary amplifier in a traditional DPA requires class C-bias In a high input power region, in this example exceeding about 5 dBm, the second amplifier 6 is switched on, and due to a high gain, the second amplifier 6 still delivers the same maximum fundamental current as that in the traditional DPA, even though the input power is lower than that of the traditional DPA. This is shown in FIG. 7 where a calculated fundamental output current of the second amplifier 6 on the y-axis is plotted against the amplifier arrangement output power $P_{out}$ for the output signal 30 of the amplifier arrangement 1' on the x-axis. At an output power $P_{out}$ of about 24 dBm, the fundamental current of the second amplifier 6 has a relatively sharp turn-on point, representing the end of a low input power region and a start of a high input power region.

As stated previously, the output combiner 10' comprises an inverting port 26 connected to the first amplifier output port 3, an amplifier arrangement output port 27, and a common port 28 connected to the second amplifier output port 7 and also to the amplifier arrangement output port 27. There is an impedance converter 29 connected between the inverting port 26 and the amplifier arrangement output port 27, and in this example the impedance converter is constituted by a transmission line 29 having a certain impedance and having a length of a quarter wavelength for a wavelength comprised in a frequency band for signals fed into the amplifier arrangement 1' via the amplifier arrangement input port 13.

Figure 8:
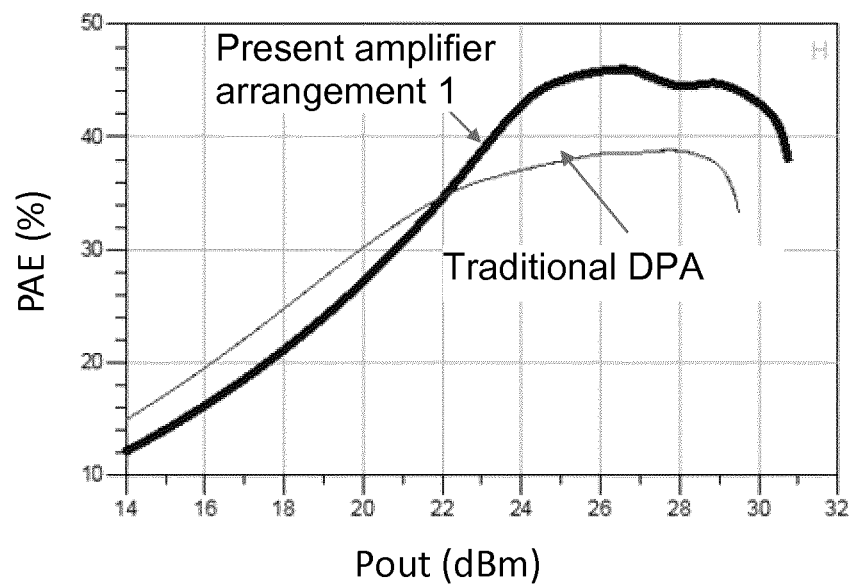

FIG. 8 shows a calculated plot of PAE in percent on the y-axis versus amplifier arrangement output power $P_{out}$ on the x-axis. The maximum PAE:s are about 46% and 39% for the present amplifier arrangement 1' and the traditional DPA, respectively.

Figure 9:
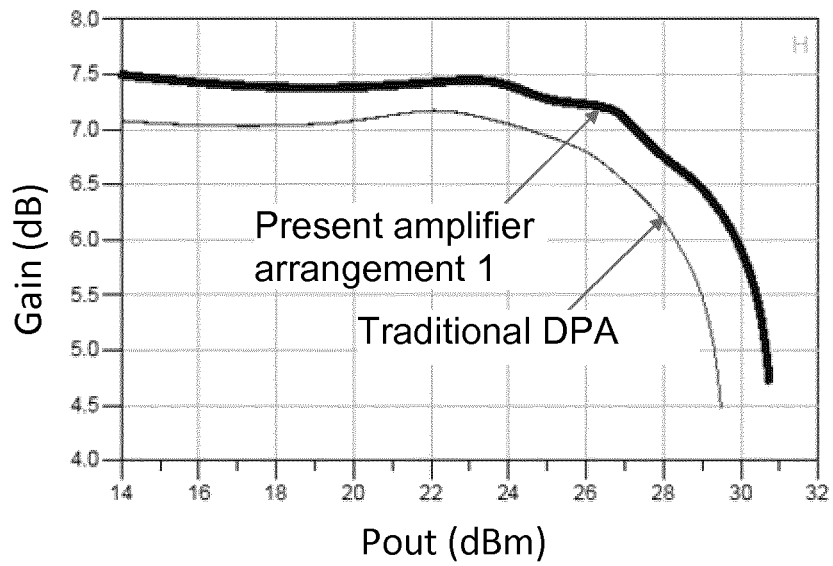

FIG. 9 shows a calculated plot of total amplifier gain on the y-axis versus amplifier arrangement output power $P_{out}$ on the x-axis. The gain of the present amplifier arrangement 1' is about 0.5 dB larger than that of a traditional DPA, and the linearity of the present amplifier arrangement 1 exceeds that of a traditional DPA.

Figure 5:
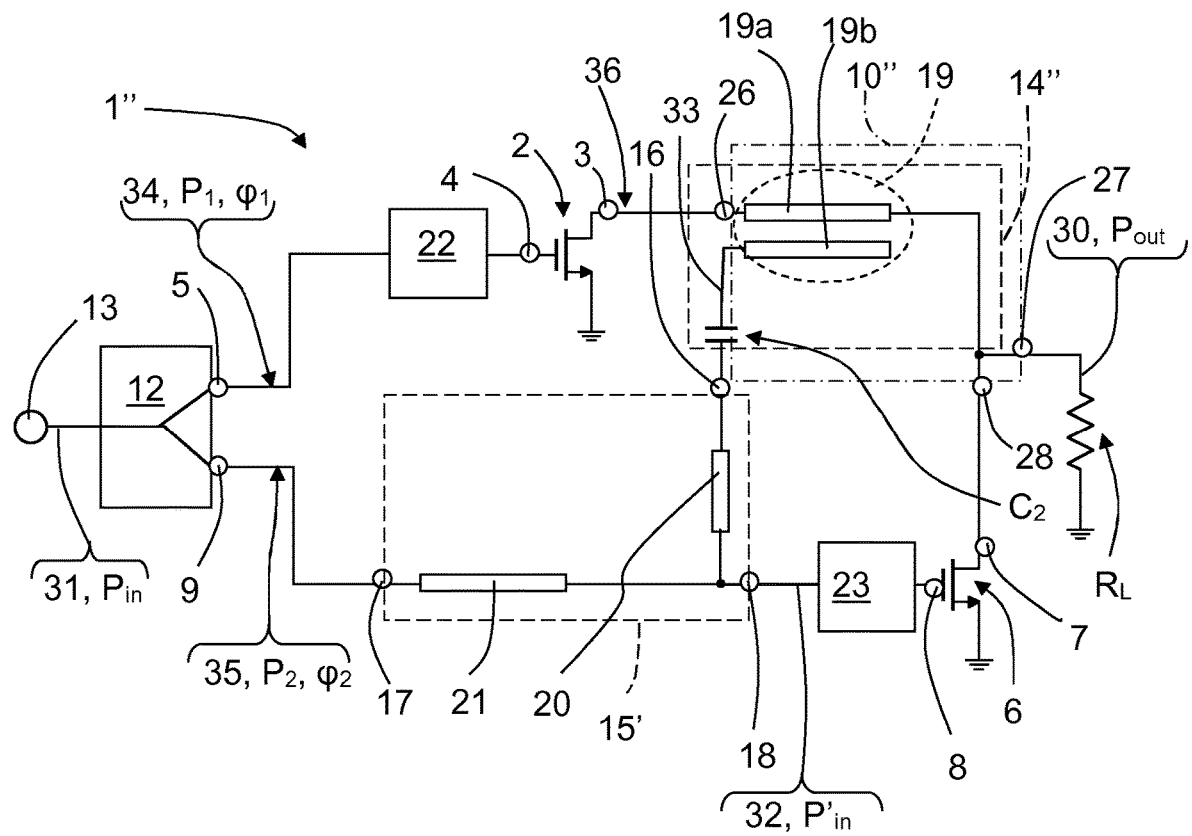
FIG. 5 shows a schematical view of a an amplifier arrangement according to a second detailed example of the present disclosure.

With reference to FIG. 5, a second more detailed example of an amplifier arrangement 1" will be described. This amplifier arrangement 1" mainly correspond to the one described with reference to FIG. 3 and FIG. 4, where, however, the coupling device 14" and the output combiner 10" are partly merged. The coupling device 14" comprises a parallel transmission line portion 19, as well as second capacitor $C_2$, that is adapted to provide the scaled output signal 33. The parallel transmission line portion 19 is shared by both the coupling device 14" and the output combiner 10" as will be described in the following.

The parallel transmission line portion 19 comprises relatively weakly coupled transmission lines 19a, 19b that have dual functions;

1) a quarter wavelength transmission line works as "impedance inverter" to realize load modulation; and
2) a fraction of the output of the first amplifier 2 is coupled, constituting the scaled output signal 33.

In this way, the coupling device 14" and the output combiner 10" are partly merged, where the coupling factor is around −20 dB.

Figure 10:
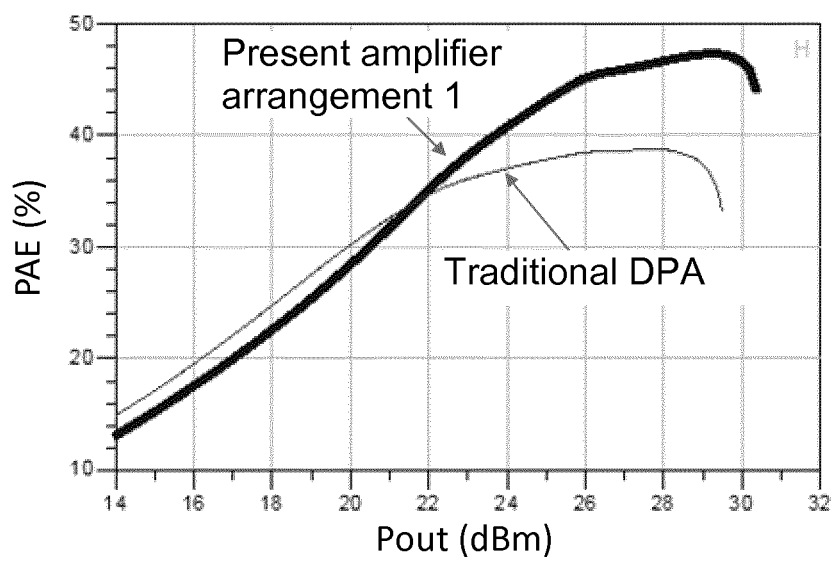
Figure 11:
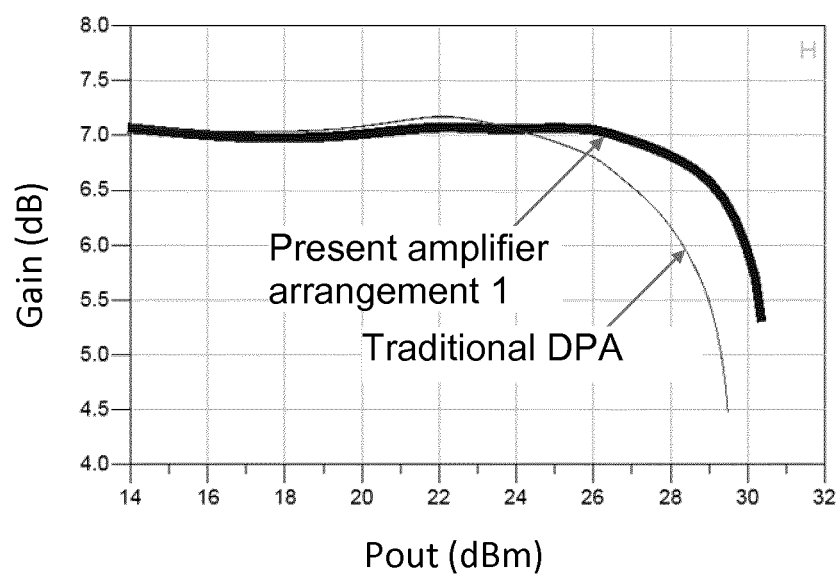

FIG. 10 and FIG. 11 correspond to FIG. 8 and FIG. 9, and show calculated graphs for the present amplifier arrangement 1" according to the second example and a traditional DPA.

FIG. 10 shows a calculated plot of PAE in percent on the y-axis versus amplifier arrangement output power $P_{out}$ on the x-axis. The maximum PAE is about 47% for the present amplifier arrangement 1", and in a high output power region, in this example exceeding about 22 dBm, the PAE of the present amplifier arrangement 1" exceeds the PAE of the traditional DPA.

FIG. 11 shows a calculated plot of gain on the y-axis versus amplifier arrangement output power $P_{out}$ on the x-axis. The gain of the present amplifier arrangement 1" and the traditional DPA is fairly equal in a low output power region, in this example about 0-24 dBm, while the gain of the present amplifier arrangement 1" exceeds the gain of a traditional DPA in a high output power region, in this example exceeding about 24 dBm. The linearity of the present amplifier arrangement 1" exceeds that of a traditional DPA, providing a trade-off between gain and linearity.

All the graphs presented for the examples above are shown for illustrative purposes only, naturally being calculated with a certain set of input parameters that can be changed in many different combinations. The graphs can be interpreted as showing a typical behavior of the present amplifier arrangement 1, 1', 1" which is compared to a typical behavior of a traditional or typical DPA.

The present disclosure is not limited to the examples above, but may vary freely within the scope of the appended claims. For example, any type of transistors and transistor configurations can be used for each one of the first amplifier and second amplifier.

Many other types of coupling devices 14, 14', 14" and output combiners 10, 10', 10" are conceivable, at least partly merged or not merged at all; some possible implantations are disclosed in U.S. Pat. No. 9,614,479. Furthermore, the power divider 12 can be made in many different ways, for example as a hybrid divider or a coupler.

Generally, the present disclosure relates to an amplifier arrangement 1 comprising a first amplifier 2, a second amplifier 6 and an output combiner 10 arranged to combine respective output signals of the first amplifier 2 and the second amplifier 6 into an output signal 30 of the amplifier arrangement 1, wherein an amplifier arrangement input signal 31 is arranged as input signal to the first amplifier 2, wherein a difference signal 32, representing a difference between the amplifier arrangement input signal 31 and a scaled output signal 33 of the first amplifier 2, is arranged as input to the second amplifier 6, wherein the output combiner 10 is arranged to modulate the loads of the first amplifier 2 and the second amplifier 6 in dependence of the output signal of the second amplifier 6.

According to some aspects, the first amplifier 2 has a first amplifier output port 3 and a first amplifier input port 4 connected to a first input port 5, and where the second amplifier 6 has a second amplifier output port 7 and a second amplifier input port 8 connected to a second input port 9, where the output combiner 10 is connected to the respective amplifier output ports 3, 7 and is adapted for load modulation, wherein the amplifier arrangement 1 further comprises a difference signal arrangement 11 that is adapted to provide the difference signal 32, which is fed to the second amplifier input port 8, where the second amplifier input port 8 is connected to the second input port 9 via the difference signal arrangement 11.

According to some aspects, the first input port 5 and the second input port 9 are connected to a power divider 12 that in turn is connected to an amplifier arrangement input port 13 for the amplifier arrangement input signal 31, where the power divider 12 is adapted to convert a signal at the amplifier arrangement input port 13 into a first input signal 34 at the first input port 5 with a first power $P_1$ and a first relative phase $\varphi_1$, and a second input signal 35 at the second input port with a second power $P_2$ and a second relative phase $\varphi_2$, such that the amplifier arrangement input signal 31 is arranged as input signal to the first amplifier 2 and the difference signal arrangement 11 via the power divider 12.

According to some aspects, the difference signal arrangement 11 comprises a coupling device 14 and a difference combiner 15, where the difference combiner 15 comprises a first combiner input port 16, a second combiner input port 17 and a difference port 18 that is adapted to output a difference between signals input at the combiner input ports 16, 17, constituting the difference signal 32, where the second combiner input port 17 is connected to the second input port 9 and the difference port 18 is connected to the second amplifier input port 8, and where the coupling device 14 is adapted to provide the scaled output signal 33 from the signal at the first amplifier output port 3 and to feed it to the first combiner input port 16.

According to some aspects, the coupling device 14' comprises a first capacitor $C_1$ that is adapted to provide the scaled output signal 33.

According to some aspects, the coupling device 14" comprises a parallel transmission line portion 19 and a capacitor $C_2$, which are adapted to provide the scaled output signal 33.

According to some aspects, the difference combiner 15' comprises a first transmission line 20, adapted for tuning the phase of the input signal 33, that is connected to the first combiner input port 16, and a second transmission line 21 connected to the second input port 17 and adapted to tune the phases of the input signals at the difference port 18 such that the difference signal 32 is generated at the difference port 18, where the transmission lines 20, 21 are connected to the difference port 18.

According to some aspects, the first amplifier input port 4 is connected to the first input port 5 via a first impedance matching network 22, and where the difference port 18 is connected to the second amplifier input port 8 via a second impedance matching network 23.

According to some aspects, each impedance matching network 22, 23 comprises a corresponding serial transmission line 24 connected in series with a corresponding serial capacitor $C_s$ and with a corresponding grounded transmission line 25.

According to some aspects, the output combiner 10 is a Doherty combiner.

According to some aspects, the output combiner 10', 10" comprises an inverting port 26 connected to the first amplifier output port 3, an amplifier arrangement output port 27, and a common port 28 connected to the second amplifier output port 7 and the amplifier arrangement output port 27, where there is an impedance inverter 19, 29 connected between the inverting port 26 and the amplifier arrangement output port 27.

According to some aspects, the impedance inverter is constituted by either one transmission line 29 or two coupled transmission lines 19a, 19b, each transmission line 29; 19a, 19b having a certain impedance and having a length of a quarter wavelength for a wavelength comprised in a frequency band for signals fed into the amplifier arrangement 1 via the amplifier arrangement input port 13.

According to some aspects, the output combiner 10" at least partly is merged with the coupling device 14".

The invention claimed is:

1. An amplifier arrangement comprising a first amplifier, a second amplifier and an output combiner arranged to combine respective output signals of the first amplifier and the second amplifier into an output signal of the amplifier arrangement,
   wherein an amplifier arrangement input signal is arranged as input signal to the first amplifier, wherein a difference signal, representing a difference between the amplifier arrangement input signal and a scaled output signal of the first amplifier, is arranged as input to the second amplifier,
   wherein the output combiner is arranged to modulate the loads of the first amplifier and the second amplifier in dependence of the output signal of the second amplifier
   wherein the amplifier arrangement further comprises a difference signal arrangement that is adapted to provide the difference signal, wherein the difference signal arrangement comprises a coupling device and a difference combiner, wherein the coupling device comprises a parallel transmission line portion, a first capacitor (C1) and a second capacitor (C2), which are adapted to provide the scaled output signal, and
   wherein the first amplifier input port is connected to the first input port via a first impedance matching network, and where the difference port is connected to the second amplifier input port via a second impedance matching network,
   wherein each of the impedance matching network comprises a corresponding serial transmission line connected in series with a corresponding serial capacitor (Cs) and with a corresponding grounded transmission line.

2. The amplifier arrangement according to claim 1, wherein the first amplifier has a first amplifier output port and a first amplifier input port connected to a first input port, and where the second amplifier has a second amplifier output port and a second amplifier input port connected to a second input port, where the output combiner is connected to the respective amplifier output ports and is adapted for load modulation, where the second amplifier input port is connected to the second input port via the difference signal arrangement.

3. The amplifier arrangement according to claim 2, wherein the first input port and the second input port are connected to a power divider that in turn is connected to an amplifier arrangement input port for the amplifier arrangement input signal, where the power divider is adapted to convert a signal at the amplifier arrangement input port into a first input signal at the first input port with a first power ($P_1$) and a first relative phase ($\varphi_1$), and a second input signal at the second input port with a second power ($P_2$) and a second relative phase ($\varphi_2$), such that the amplifier arrangement input signal is arranged as input signal to the first amplifier and the difference signal arrangement via the power divider.

4. The amplifier arrangement according to claim 1, wherein the difference combiner comprises a first combiner input port, a second combiner input port and a difference port that is adapted to output a difference between signals input at the combiner input ports, constituting the difference signal, where the second combiner input port is connected to the second input port and the difference port is connected to the second amplifier input port, and where the coupling device is adapted to provide the scaled output signal from the signal at the first amplifier output port and to feed it to the first combiner input port.

5. The amplifier arrangement according to claim 1, wherein the output combiner is a Doherty combiner.

6. The amplifier arrangement according to claim 1, wherein the output combiner comprises an inverting port connected to the first amplifier output port, an amplifier arrangement output port, and a common port connected to the second amplifier output port and the amplifier arrangement output port, where there is an impedance inverter connected between the inverting port and the amplifier arrangement output port.

7. The amplifier arrangement according to claim 4, wherein the difference combiner further comprises a first transmission line, adapted for tuning the phase of the input signal, that is connected to the first combiner input port, and a second transmission line connected to the second input port and adapted to tune the phases of the input signals at the difference port such that the difference signal is generated at the difference port, where the transmission lines are connected to the difference port.

8. The amplifier arrangement according to claim 6, wherein the impedance inverter is constituted by either one transmission line or two coupled transmission lines, each transmission line having a certain impedance and having a length of a quarter wavelength for a wavelength comprised in a frequency band for signals fed into the amplifier arrangement via the amplifier arrangement input port.

9. The amplifier arrangement according to claim 8, wherein the output combiner at least partly is merged with the coupling device.

* * * * *